(12) United States Patent  (10) Patent No.: US 9,184,405 B2
Song et al.  (45) Date of Patent: Nov. 10, 2015

(54) ORGANIC LIGHT EMITTING DISPLAY DEVICE

(71) Applicant: LG DISPLAY CO., LTD., Seoul (KR)

(72) Inventors: Ki-Woog Song, Goyang-si (KR); Sung-Hoon Pieh, Seoul (KR); Seok-Joon Oh, Paju-si (KR); Youn-Seok Kam, Seoul (KR); Dong-Hyuk Kim, Seoul (KR); Seon-Keun Yoo, Gunpo-si (KR); Tae-Shick Kim, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 10 days.

(21) Appl. No.: 14/073,709

(22) Filed: Nov. 6, 2013

(65) Prior Publication Data

US 2014/0124766 A1  May 8, 2014

(30) Foreign Application Priority Data

Nov. 8, 2012 (KR) .................. 10-2012-0125922
Oct. 17, 2013 (KR) .................. 10-2013-0123784

(51) Int. Cl.
*H01L 51/00* (2006.01)
*H01L 51/50* (2006.01)
*H01L 27/32* (2006.01)

(52) U.S. Cl.
CPC ........ *H01L 51/5024* (2013.01); *H01L 27/3209* (2013.01); *H01L 51/5004* (2013.01); *H01L 51/504* (2013.01); *H01L 51/5016* (2013.01); *H01L 2251/5376* (2013.01); *H01L 2251/5384* (2013.01)

(58) Field of Classification Search
CPC ............ H01L 51/5004; H01L 51/5016; H01L 51/504; H01L 51/5024; H01L 51/5296; H01L 27/3209
USPC .......................................................... 257/40
See application file for complete search history.

(56) References Cited

U.S. PATENT DOCUMENTS

2005/0238918 A1* 10/2005 Igarashi ..................... 428/690
2005/0280008 A1* 12/2005 Ricks et al. ................. 257/79
2006/0251921 A1* 11/2006 Forrest et al. ............... 428/690
2012/0098012 A1*  4/2012 Kim et al. .................. 257/98

* cited by examiner

*Primary Examiner* — Victor A Mandala
*Assistant Examiner* — Quovaunda V Jefferson
(74) *Attorney, Agent, or Firm* — Birch, Stewart, Kolasch & Birch, LLP

(57) ABSTRACT

An organic light emitting display device includes first and second electrodes facing each other on a substrate, at least one emission layer formed between the first and second electrodes, a hole transport layer formed between the first electrode and the emission layer, and an electron transport layer formed between the second electrode and the emission layer, wherein the emission layer includes a first emission mixed layer formed on the hole transport layer, the first emission mixed layer including a first hole-type host and a first phosphorescent dopant, and a second emission mixed layer formed between the first emission mixed layer and the electron transport layer, the second emission mixed layer including a first electron-type host and a second phosphorescent dopant.

14 Claims, 11 Drawing Sheets

ORGANIC LIGHT EMITTING DISPLAY DEVICE

This application claims the benefit of Korean Patent Applications No. 10-2012-0125922, filed on Nov. 8, 2012 and No. 10-2013-0123784, filed on Oct. 17, 2013, which are hereby incorporated by reference as if fully set forth herein.

BACKGROUND OF THE INVENTION

1. Field of the Invention

The present invention relates to an organic light emitting display device which may prevent deterioration of luminous efficiency and lifespan.

2. Discussion of the Related Art

Recent transition into an information-oriented society has caused rapid development in the field of displays to visually represent electrical information signals, and correspondingly a variety of flat panel display devices exhibiting excellent properties, such as being thin and lightweight as well as requiring low power consumption, have been developed.

Representative examples of these flat panel display devices may include Liquid Crystal Display (LCD) devices, Plasma Display Panel (PDP) devices, Field Emission Display (FED) devices, and Organic Light Emitting Diode (OLED) display devices.

In particular, organic light emitting display devices are self-illuminating devices, and have faster response speed, higher luminous efficiency and brightness, and wider viewing angle than other flat panel display devices.

Typically, such an organic light emitting display device includes an anode and a cathode arranged to face each other with an emission layer interposed therebetween, such that an electron-hole pair, i.e. an exciton is generated via recombination of a hole injected from the anode and an electron injected from the cathode within the emission layer, and in turn light is emitted via transition of the exciton to the equilibrium state. However, in the typical OLED device, the exciton generated in the emission layer spreads out through the emission layer to interfaces with an electron transport layer and a hole transport layer proximate to the emission layer, which reduces luminous efficiency and causes rapid deterioration of the electron transport layer and the hole transport layer proximate to the emission layer, resulting in reduction of lifespan.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device which may prevent deterioration of luminous efficiency and lifespan.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, an organic light emitting display device includes first and second electrodes arranged on a substrate to face each other, at least one emission layer formed between the first and second electrodes, a hole transport layer formed between the first electrode and the emission layer, and an electron transport layer formed between the second electrode and the emission layer, wherein the emission layer includes a first emission mixed layer formed on the hole transport layer, the first emission mixed layer including a first hole-type host and a first phosphorescent dopant, and a second emission mixed layer formed between the first emission mixed layer and the electron transport layer, the second emission mixed layer including a first electron-type host and a second phosphorescent dopant.

The first emission mixed layer may further include a second hole-type host.

The second emission mixed layer may further include a second electron-type host.

The second emission mixed layer may further include a second electron-type host, and the first emission mixed layer may further include at least one electron-type host among the first and second electron-type hosts, or a second hole-type host.

The first emission mixed layer may further include a second electron-type host, and the second emission mixed layer may further include a second hole-type host.

The content of the first hole-type host may be higher than the content of the second electron-type host in the first emission mixed layer, and the content of the first electron-type host may be higher than the content of the second hole-type host in the second emission mixed layer.

A difference between the Lowest Unoccupied Molecular Orbital (LUMO) level of each of the first and second electron-type hosts and the LUMO level of the electron transport layer may be ±0.5 eV or less, and a difference between the Highest Occupied Molecular Orbital (HOMO) level of each of the first and second hole-type hosts and the HOMO level of the hole transport layer may be ±0.5 eV or less.

The first and second hole-type hosts may have a hole mobility of $1.0 \times 10^{-6}$ Vs/cm$^2$ to $5.0 \times 10^{-3}$ Vs/cm$^2$.

The first and second electron-type hosts may have an electron mobility of $1.0 \times 10^{-6}$ Vs/cm$^2$ to $5.0 \times 10^{-3}$ Vs/cm$^2$.

The at least one emission layer may include at least two emission layers, and the organic light emitting display device may further include an N-type charge generation layer and a P-type charge generation layer sequentially stacked one above another between the emission layers.

The first and second phosphorescent dopants may be formed of the same material or different materials.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

Figure 1:
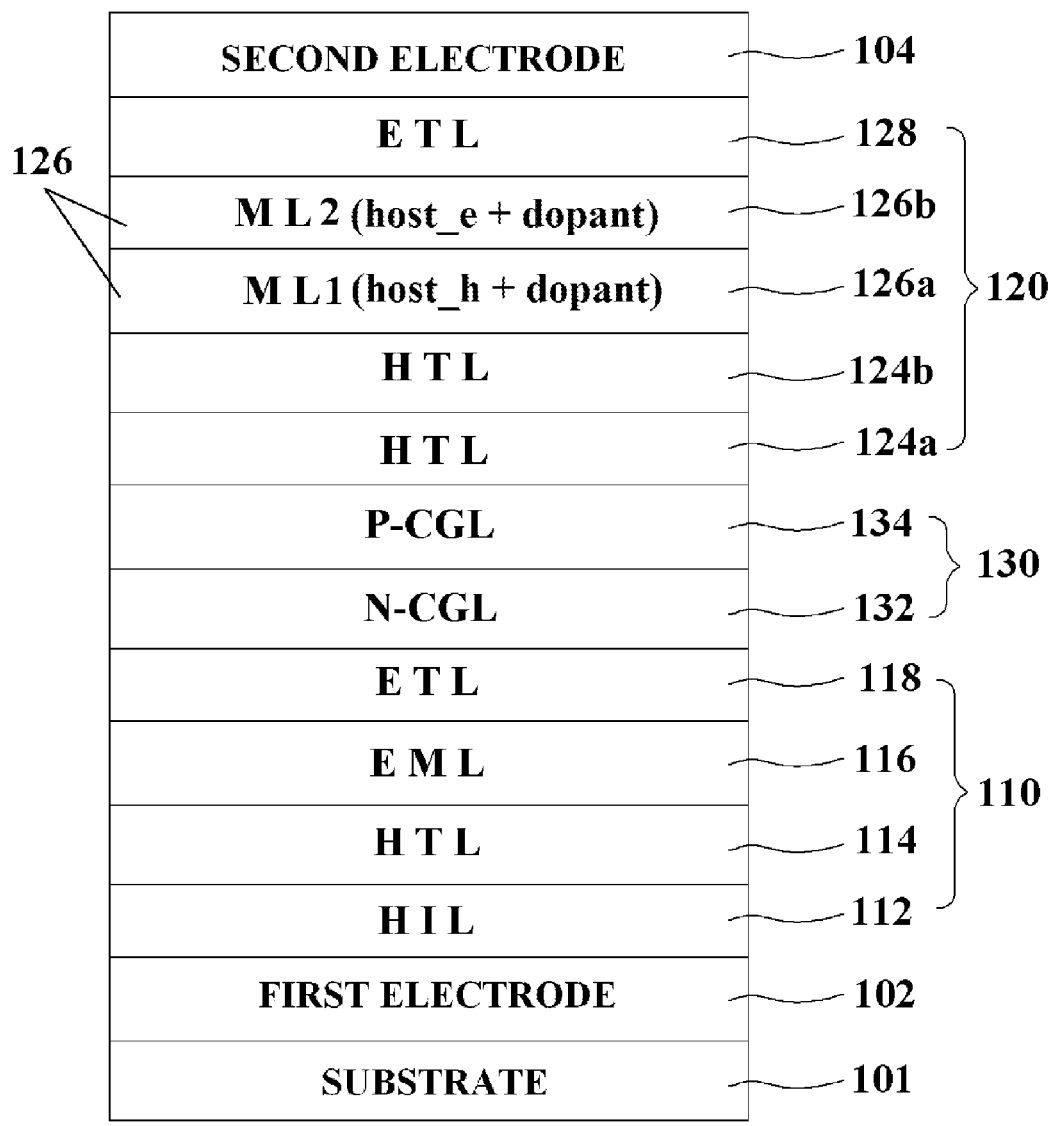
FIG. 1 is a sectional view showing an organic light emitting display device according to a first embodiment of the present invention.
Figure 2:
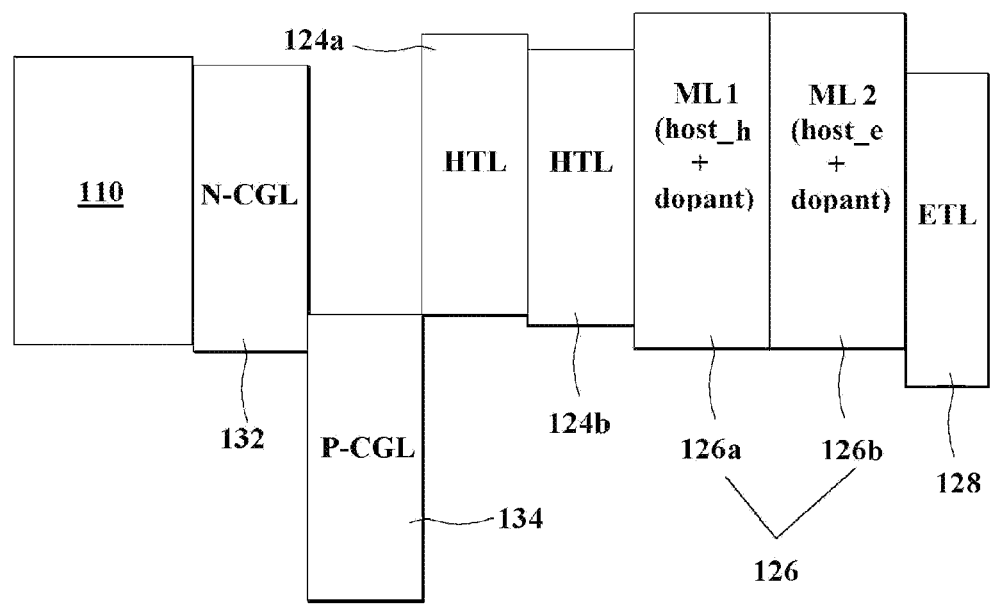
FIG. 2 is a band diagram of the organic light emitting display device shown in FIG. 1.

FIG. 1 is a sectional view showing an organic light emitting display device according to a first embodiment of the present invention. FIG. 2 is a band diagram of the organic light emitting display device shown in FIG. 1.

The organic light emitting display device exemplarily shown in FIGS. 1 and 2 includes first and second electrodes 102 and 104 arranged to face each other, first and second light emitting units 110 and 120 formed between the first and second electrodes 102 and 104, and a charge generation layer 130 located between the first and second light emitting units 110 and 120.

At least one of the first and second electrodes 102 and 104 takes the form of a transparent electrode. If the first electrode 102 is a transparent electrode and the second electrode 104 is an opaque electrode, a bottom emission configuration to emit light downward is achieved. If the second electrode 104 is a transparent electrode and the first electrode 102 is an opaque electrode, a top emission configuration to emit light upward is achieved. If both the first and second electrodes 102 and 104 are transparent electrodes, a double-sided emission configuration to emit light upward and downward is achieved.

The transparent electrode may include an Indium Tin Oxide (ITO) or Indium Zinc Oxide (IZO) electrode, for example. The opaque electrode may be formed of a reflective metal material, such as aluminum (Al), gold (Au), molybdenum (MO), chrome (Cr), copper (Cu), lithium fluoride (LiF), or the like, or may take the form of a dual layer using the same.

In the present invention, a configuration in which the first electrode 102 is an anode in the form of a transparent electrode and the second electrode 104 is a cathode in the form of an opaque electrode will be described by way of example.

The first light emitting unit 110 is formed between the first electrode 102 and an N-type charge generation layer (N-CGL) 132. The first light emitting unit 110 includes a hole injection layer (HIL) 112, at least one first hole transport layer (HTL) 114, a first emission layer (EML) 116, and a first electron transport layer (ETL) 118, which are sequentially formed on the first electrode 102. The first hole transport layer 114 supplies a hole from the first electrode 102 to the first emission layer 116, and the first electron transport layer 118 supplies an electron from the N-type charge generation layer 132 to the first emission layer 116. The first emission layer 116 generates light via recombination of the hole supplied through the first hole transport layer 114 and the electron supplied through the first electron transport layer 118.

The second light emitting unit 120 is formed between the second electrode 104 and a P-type charge generation layer (P-CGL) 134. The second light emitting unit 120 includes a second hole transport layer (HTL) 124a, a third hole transport layer (HTL) 124b, a second emission layer (EML) 126, and a second electron transport layer (ETL) 128, which are sequentially formed on the P-type charge generation layer 134. The second and third hole transport layers 124a and 124b supply a hole from the P-type charge generation layer 134 to the second emission layer 126, and the second electron transport layer 128 supplies an electron from the second electrode 104 to the second emission layer 126. The second emission layer 126 generates light via recombination of the hole supplied through the second and third hole transport layers 124a and 124b and the electron supplied through the second electron transport layer 128.

The charge generation layer 130 includes the N-type charge generation layer 132 and the P-type charge generation layer 134 stacked one above another.

The N-type charge generation layer 132 is located closer to the first electrode 102 than the P-type charge generation layer 134. The N-type charge generation layer 132 serves to draw an electron as an n-type charge carrier separated from an interface between the P-type charge generation layer 134 and the second hole transport layer 124a. The N-type charge generation layer 132 is formed by doping an organic material with alkali metal particles.

The P-type charge generation layer 134 is located closer to the second electrode 104 than the N-type charge generation layer 132. Generation and separation of an electron as an n-type charge carrier and a hole as a p-type charge carrier are achieved at an interface between the P-type charge generation layer 134 and the second hole transport layer 124a.

The separated electron moves to the first light emitting unit 110 through the N-type charge generation layer 132 and is bound with the hole moved from the first electrode 102 in the first emission layer 116 of the first light emitting unit 110 to generate an exciton. Thereby, emission of visible light is achieved via discharge of energy from the exciton.

The separated hole moves to the second light emitting unit 120 and is bound with the electron moved from the second electrode 104 in the second emission layer 126 to generate an exciton. Thereby, emission of visible light is achieved via discharge of energy from the exciton.

Here, the first emission layer 116 may be an emission layer containing a blue fluorescent dopant and a host to emit blue light, and the second emission layer 126 may be an emission layer containing a red-green phosphorescent dopant and a host to emit orange light, resulting in emission of white light. Various other fluorescent and phosphorescent dopants may be used to achieve emission of white light.

In particular, the second emission layer 126 containing the phosphorescent dopant includes first and second emission mixed layers (ML1 and ML2) 126a and 126b.

The first emission mixed layer 126a is formed on the third hole transport layer 124b to come into contact with the third hole transport layer 124b. The first emission mixed layer 126a is formed by mixing a hole-type host host_h having excellent transport of a hole into the second emission layer 126 and a phosphorescent dopant with each other. The phosphorescent dopant is a phosphorescent yellow-green dopant, and is formed of tris(2-phenylpyridine)iridium, for example. The phosphorescent dopant occupies about 5 to 15% of the first emission mixed layer 126a. A difference between the HOMO level of the hole-type host host_h and the HOMO level of the third hole transport layer 124b is ±0.5 eV or less. The hole-type host host_h is formed of a material having a hole mobility of $1.0 \times 10^{-6}$ Vs/cm$^2$ to $5.0 \times 10^{-3}$ Vs/cm$^2$. To this end, the hole-type host host_h is formed of a material different from or equal to that of the third hole transport layer 124b. For example, the hole-type host host_h is formed of TCTA (4,4',4"-tris(N-carbazolyl)-triphenylamine), or CBP (4,4'-bis(carbazol-9-yl)biphenyl).

The second emission mixed layer 126b is formed on the first emission mixed layer 126a to come into contact with the second electron transport layer 128. The second emission mixed layer 126b is formed by mixing an electron-type host host_e having excellent transport of an electron into the second emission layer 126 and a phosphorescent dopant with each other. The phosphorescent dopant is a phosphorescent yellow-green dopant in the same manner as in the first emission mixed layer 126a, and occupies about 5 to 15% of the second emission mixed layer 126b. A difference between the Lowest Unoccupied Molecular Orbital (LUMO) level of the electron-type host host_e and the LUMO level of the second electron transport layer 128 is ±0.5 eV or less. The electron-type host host_e is formed of a material having an electron mobility of $1.0 \times 10^{-6}$ Vs/cm$^2$ to $5.0 \times 10^{-3}$ Vs/cm$^2$. To this end, the electron-type host host_e is formed of a material different from or equal to that of the second electron transport layer 128. For example, the electron-type host host_e is formed of UGH3 (m-bis-(triphenylsilyl)benzene), or TAZ (3-phenyl-4-(1'-naphthyl)-5-phenyl-1,2,4-triazole).

As such, the organic light emitting display device according to the first embodiment of the present invention ensures easy hole and electron injection into the first and second emission mixed layers 126a and 126b via the electron-type host host_e and the hole-type host host_h, achieving voltage reduction as compared to the related art. In addition, in the organic light emitting display device according to the first embodiment of the present invention, the hole and the electron, injected through the hole transport layer and the electron transport layer, move to an interface between the first and second emission mixed layers 126a and 126b, which may prevent loss of an exciton (i.e. electron-hole pair), and consequently prevent deterioration of luminous efficiency. Moreover, limiting an area for recombination of the hole and the electron to the emission layer 126 may increase lifespan and stability. Price reduction may further be accomplished via reduction in the content of the phosphorescent dopant.

Table 1 represents electro-optic properties of an organic light emitting display device of the related art and the white organic light emitting display device according to the first embodiment of the present invention.

TABLE 1

| Condition | T95(50 mA/cm$^2$) | 10 mA/cm$^2$ | | |
|---|---|---|---|---|
| | | Volt(V) | Cd/A | Efficiency Ratio |
| Related Art | 137 hours | 3.6 | 76.5 | 0.73 |
| First Embodiment | 182 hours | 3.2 | 79.4 | 0.77 |

In table 1, a configuration of the related art includes a single emission layer in which two hosts and a dopant are mixed with each other, and T95 means time taken until the lifespan of a white organic light emitting display device reaches about 95%. As exemplarily shown in table 1 and FIG. 3A, the white organic light emitting display device of the related art (curve A) takes 137 hours until the lifespan thereof reaches 95%, whereas the white organic light emitting display device according to the present invention (curve B) takes 182 hours until the lifespan thereof reaches 95%, and thus it will be appreciated that the present invention has longer lifespan than the related art. In addition, as exemplarily shown in FIG. 3B, it will be appreciated that the organic light emitting display device according to the present invention (curve B) has higher current density depending on voltage than that of the related art (curve A), thus requiring a lower voltage for acquisition of the same current density than that of the related art by about 0.4V per 10 mA/cm$^2$. In particular, as exemplarily shown in table 1, it will be appreciated that drive voltage in the first embodiment of the present invention is lower than that of the related art. In addition, as exemplarily shown in FIG. 3C, it will be appreciated that the organic light emitting display device according to the present invention (curve B) has higher brightness and thus less efficiency deterioration than that of the related art (curve A). Accordingly, it will be appreciated that the ratio of efficiency at 50 mA/cm$^2$ to efficiency at 10 mA/cm$^2$ is higher in the present invention than in the related art, thus achieving reduced efficiency roll-off depending on brightness increase.

Figure 3A:
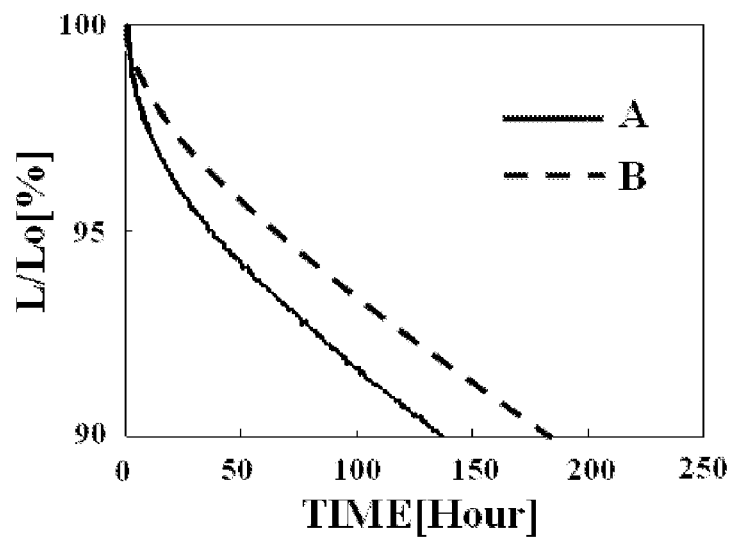
FIGS. 3A to 3C are explanatory views of electro-optic properties of an organic light emitting display device of the related art and the organic light emitting display device according to the first embodiment of the present invention.
Figure 3B:
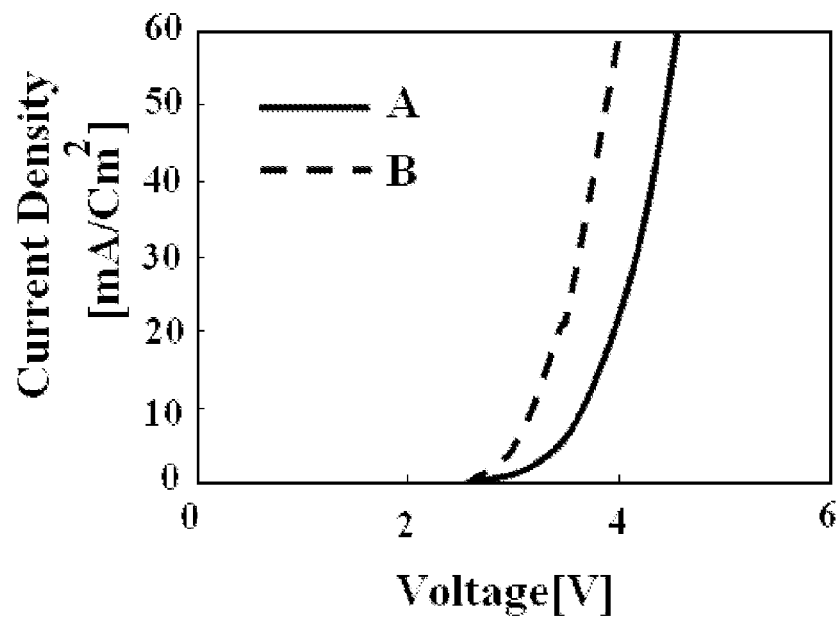
Figure 3C:
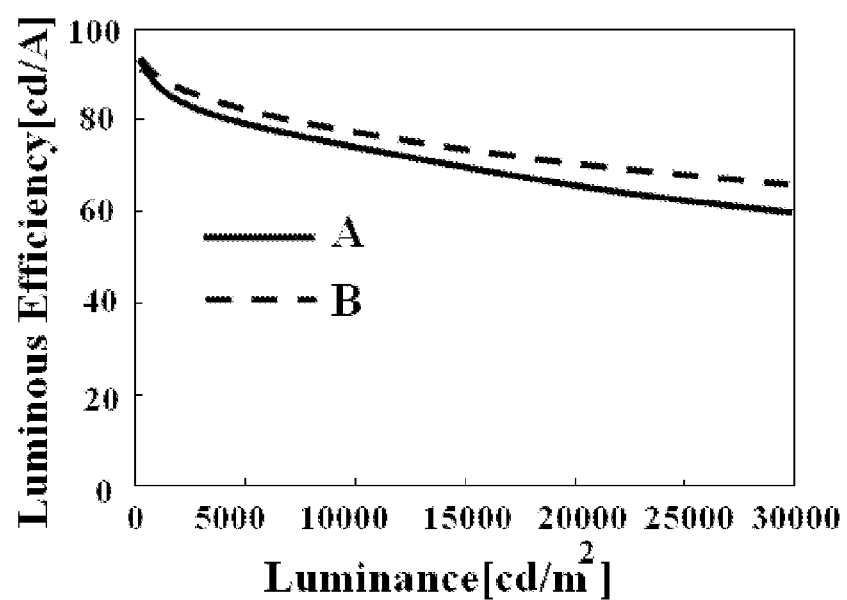

As described above, it will be appreciated that the organic light emitting display device according to the first embodiment of the present invention is superior to the organic light emitting display device of the related art in terms of lifespan, drive voltage (V), and luminance (cd/A) as exemplarily shown in table 1 and FIGS. 3A to 3C.

Although the organic light emitting display device according to the first embodiment of the present invention has been described as having a tandem configuration using a plurality of light emitting units by way of example, the organic light emitting display device may be applied to a configuration using a single light emitting unit.

Figure 4:
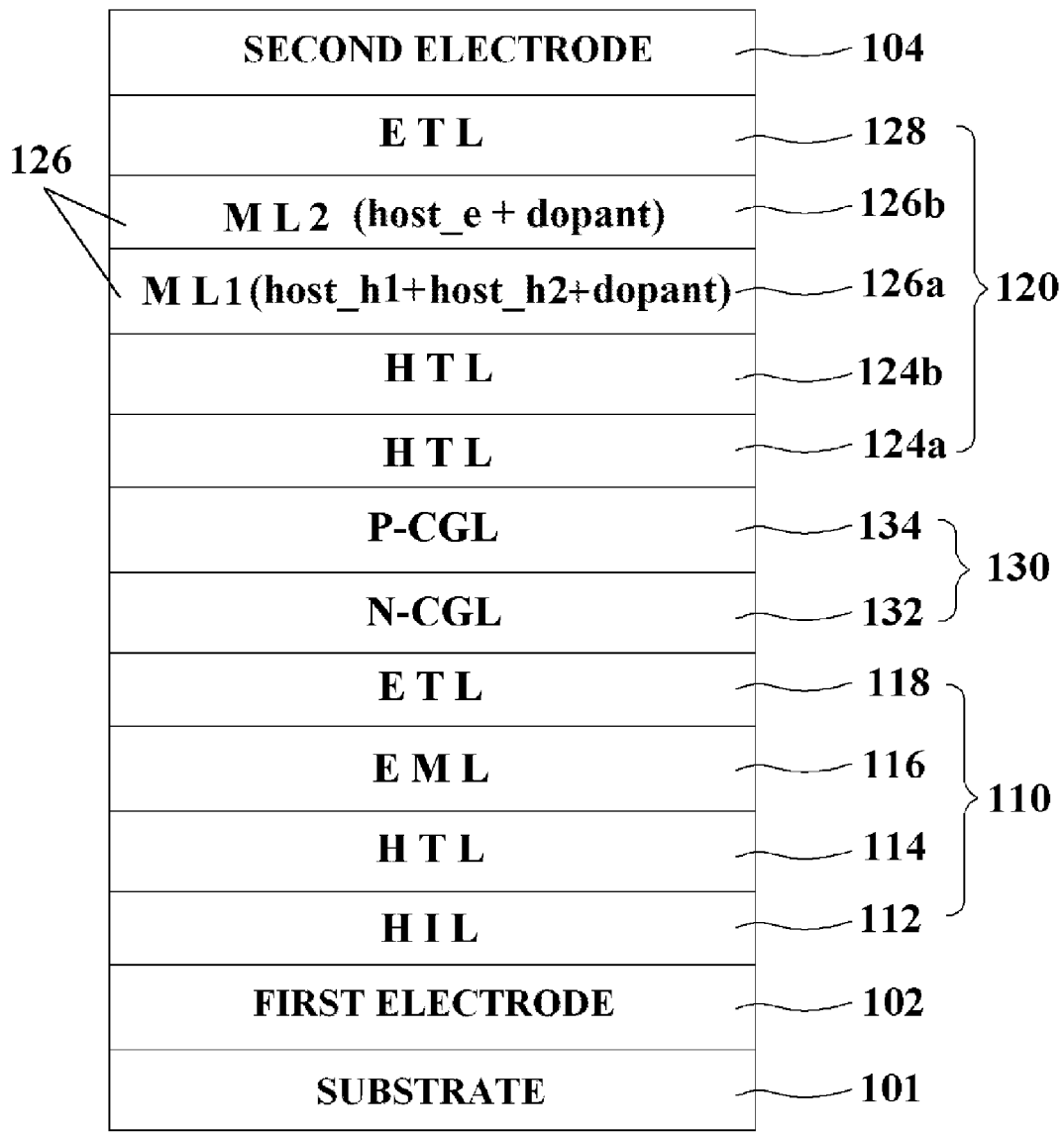
FIG. 4 is a sectional view showing an organic light emitting display device according to a second embodiment of the present invention.

FIG. 4 is a sectional view showing an organic light emitting display device according to a second embodiment of the present invention.

The organic light emitting display device exemplarily shown in FIG. 4 includes the same components as those of the organic light emitting display device exemplarily shown in FIG. 1 except for the second emission layer 126. Thus, a detailed description of the same components will be omitted hereinafter.

The second emission layer 126 includes the first and second emission mixed layers (ML1 and ML2) 126a and 126b.

The first emission mixed layer 126a is formed on the third hole transport layer 124b to come into contact with the third hole transport layer 124b. The first emission mixed layer 126a is formed by mixing first and second hole-type hosts host_h1 and host_h2 and a first phosphorescent dopant with each other. The first phosphorescent dopant is a phosphorescent yellow-green dopant, and is formed of tris(2-phenylpyridine)iridium, for example. The first phosphorescent dopant occupies about 5 to 15% of the first emission mixed layer 126a. A difference between the HOMO level of each of the first and second hole-type hosts host_h1 and host_h2 and the HOMO level of the third hole transport layer 124b is ±0.5 eV or less. To this end, the first and second hole-type hosts host_h1 and host_h2 are formed of a material different from or equal to that of the third hole transport layer 124b, and the first and second hole-type hosts host_h1 and host_h2 are formed of the same material or different materials. The first and second hole-type hosts host_h1 and host_h2 are formed of a material having a hole mobility of $1.0 \times 10^{-6}$ Vs/cm² to $5.0 \times 10^{-3}$ Vs/cm². In particular, any one hole-type host among the first and second hole-type hosts host_h1 and host_h2 is formed of a material having excellent transport of a hole into the second emission layer 126, and the other hole-type host is formed of a material having excellent energy transfer to the dopant. For example, the first and second hole-type hosts host_h1 and host_h2 are formed of TCTA (4,4',4"-tris(N-carbazolyl)-triphenylamine), or CBP (4,4'-bis(carbazol-9-yl) biphenyl).

The second emission mixed layer 126b is formed on the first emission mixed layer 126a to come into contact with the second electron transport layer 128. The second emission mixed layer 126b is formed by mixing an electron-type host host_e having excellent transport of an electron into the second emission layer 126 and a second phosphorescent dopant with each other. The second phosphorescent dopant is a phosphorescent yellow-green dopant in the same manner as in the first emission mixed layer 126a, and occupies about 5 to 15% of the second emission mixed layer 126b. A difference between the LUMO level of the electron-type host host_e and the LUMO level of the second electron transport layer 128 is ±0.5 eV or less. The electron-type host host_e is formed of a material having an electron mobility of $1.0 \times 10^{-6}$ Vs/cm² to $5.0 \times 10^{-3}$ Vs/cm². To this end, the electron-type host host_e is formed of a material different from or equal to that of the second electron transport layer 128. For example, the electron-type host host_e is formed of UGH3 (m-bis-(triphenyl-silyl)benzene), or TAZ (3-phenyl-4-(1'-naphthyl)-5-phenyl-1,2,4-triazole).

As such, the organic light emitting display device according to the present invention ensures easy hole and electron injection into the first and second emission mixed layers 126a and 126b, achieving voltage reduction as compared to the related art. In addition, in the organic light emitting display device according to the present invention, the hole and the electron, injected through the hole transport layer and the electron transport layer, move to an interface between the first and second emission mixed layers 126a and 126b, which may prevent loss of an exciton (i.e. electron-hole pair), and consequently prevent deterioration of luminous efficiency. Moreover, limiting an area for recombination of the hole and the electron to the emission layer 126 may prevent deterioration of the electron transport layer 128 and the hole transport layer 124b proximate to the emission layer 126, achieving extended lifespan and enhanced stability.

Table 2 represents electro-optic properties of an organic light emitting display device of the related art and the white organic light emitting display device according to the second embodiment of the present invention.

TABLE 2

| Condition | T95(50 mA/cm²) | 10 mA/cm² | | |
| --- | --- | --- | --- | --- |
| | | Volt(V) | Cd/A | Efficiency Ratio |
| Related Art | 137 hours | 3.6 | 76.5 | 0.73 |
| Second Embodiment | 212 hours | 3.3 | 80.1 | 0.78 |

In table 2, a configuration of the related art includes a single emission layer in which two hosts and a dopant are mixed with each other, and T95 means time taken until the lifespan of the white organic light emitting display device reaches about 95%. As exemplarily shown in table 2 and FIG. 5A, the white organic light emitting display device of the related art (curve A) takes 137 hours until the lifespan thereof reaches 95%, whereas the white organic light emitting display device according to the present invention (curve C) takes 212 hours until the lifespan thereof reaches 95%, and thus it will be appreciated that the present invention has longer lifespan than the related art. In addition, as exemplarily shown in FIG. 5B, it will be appreciated that the organic light emitting display device according to the present invention (curve C) has higher current density depending on voltage than that of the related art (curve A), thus requiring a lower voltage for acquisition of the same current density than the related art by about 0.3V per 10 mA/cm². In particular, as exemplarily shown in table 2, it will be appreciated that drive voltage in the second embodiment of the present invention is lower than that of the related art. In addition, as exemplarily shown in FIG. 5C, it will be appreciated that the organic light emitting display device according to the present invention (curve C) has higher brightness and thus less efficiency deterioration than that of the related art (curve A). Accordingly, it will be appreciated that the ratio of efficiency at 50 mA/cm² to efficiency at 10 mA/cm² is higher in the present invention than in the related art, thus achieving reduced roll-off depending on brightness increase.

Figure 5A:
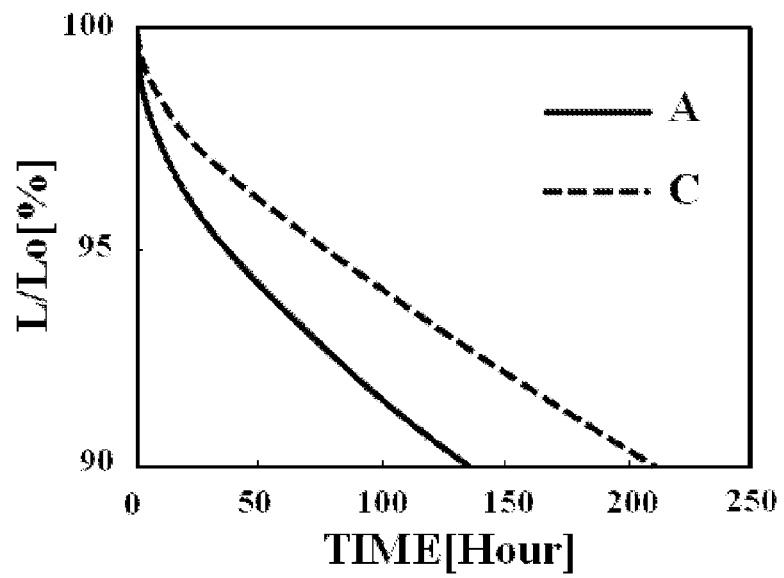
FIGS. 5A to 5C are explanatory views of electro-optic properties of an organic light emitting display device of the related art and the organic light emitting display device according to the second embodiment of the present invention.
Figure 5B:
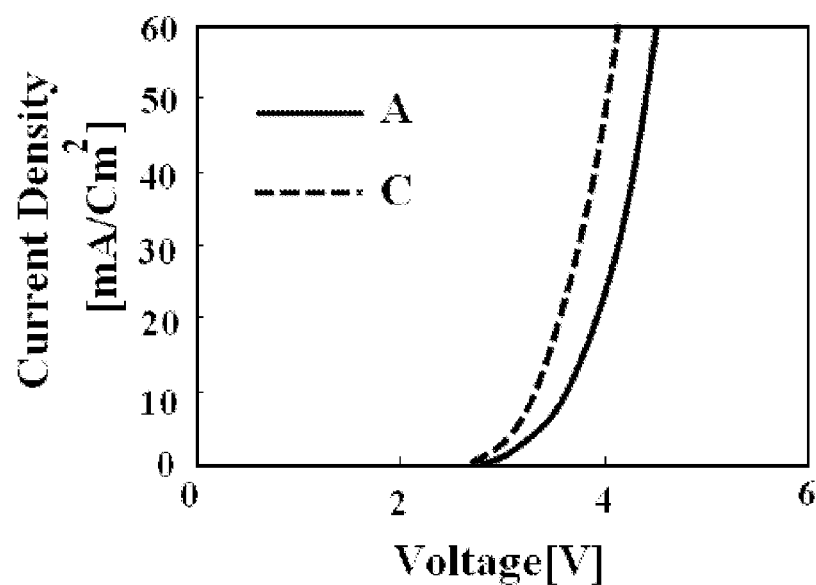
Figure 5C:
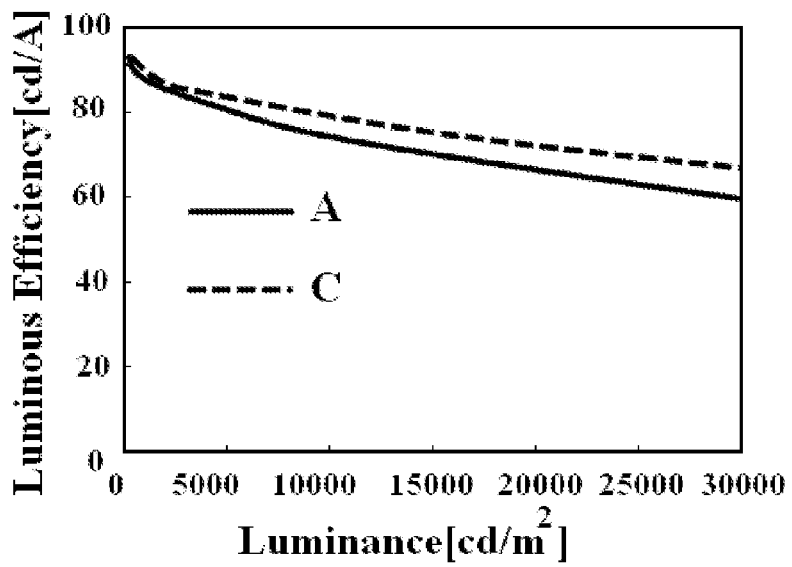

As described above, it will be appreciated that the organic light emitting display device according to the second embodiment of the present invention is superior to the organic light emitting display device of the related art in terms of lifespan, drive voltage (V), and luminance (cd/A) as exemplarily shown in table 2 and FIGS. 5A to 5C.

Although the organic light emitting display device according to the second embodiment of the present invention has been described as having a tandem configuration using a plurality of light emitting units by way of example, the organic light emitting display device may be applied to a configuration using a single light emitting unit.

Figure 6:
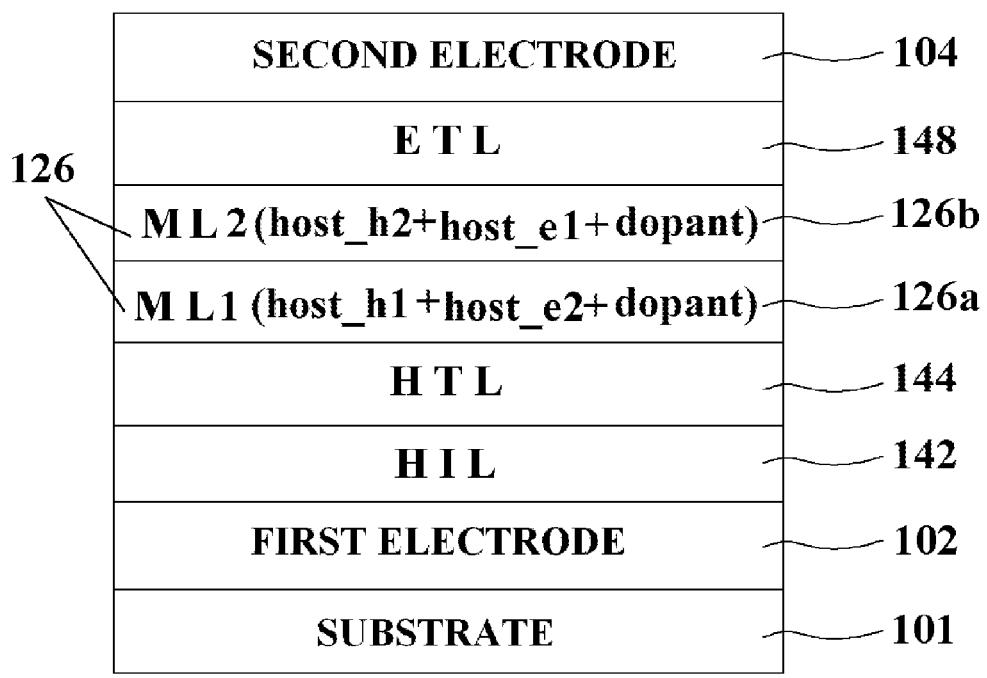
FIG. 6 is a sectional view showing an organic light emitting display device according to a third embodiment of the present invention.

FIG. 6 is a sectional view showing an organic light emitting display device according to a third embodiment of the present invention.

The organic light emitting display device exemplarily shown in FIG. 6 includes the first and second electrodes 102 and 104 arranged to face each other as well as a hole injection layer 142, hole transport layer 144, emission layer 126, and electron transport layer 148 which are formed between the first and second electrodes 102 and 104. Here, the other components except for the emission layer 126 have been described above in the first embodiment of the present invention, and thus a detailed description of these components will be omitted hereinafter.

The emission layer 126 includes the first and second emission mixed layers (ML1 and ML2) 126a and 126b.

The first emission mixed layer 126a is formed on the hole transport layer 144 to come into contact with the hole transport layer 144. The first emission mixed layer 126a is formed by mixing a first hole-type host host_h1, a second electron-type host_e2, and a first phosphorescent dopant with each other.

The second emission mixed layer 126b is formed on the first emission mixed layer 126a to come into contact with the electron transport layer 148. The second emission mixed layer 126b is formed by mixing a first electron-type host host_e1, a second hole-type host_h2, and a second phosphorescent dopant with each other.

Each of the first and second phosphorescent dopants occupies about 5 to 15% of each of the first and second emission mixed layers 126a and 126b. A material of the first phosphorescent dopant contained in the first emission mixed layer 126a is equal to or different from a material of the second phosphorescent dopant contained in the second emission mixed layer 126b.

A difference between the LUMO level of each of the first and second electron-type hosts host_e1 and host_e2 and the LUMO level of the electron transport layer 148 is ±0.5 eV or less. Each of the first and second electron-type hosts host_e1 and host_e2 is formed of a material having an electron mobility of $1.0\times10^{-6}$ Vs/cm$^2$ to $5.0\times10^{-3}$ Vs/cm$^2$. To this end, each of the first and second electron-type hosts host_e1 and host_e2 is formed of a material equal to or different from that of the electron transport layer 148. For example, the first and second electron-type hosts host_e1 and host_e2 are formed of UGH3 (m-bis-(triphenylsilyl)benzene), or TAZ (3-phenyl-4-(1'-naphthyl)-5-phenyl-1,2,4-triazole). Here, the second electron-type host host_e2 in the first emission mixed layer 126a and the first electron-type host host_e1 in the second emission mixed layer 126b are formed of the same material or different materials.

A difference between the HOMO level of each of the first and second hole-type hosts host_h1 and host_h2 and the HOMO level of the hole transport layer 144 is ±0.5 eV or less. Each of the first and second hole-type hosts host_h1 and host_h2 is formed of a material having a hole mobility of $1.0\times10^{-6}$ Vs/cm$^2$ to $5.0\times10^{-3}$ Vs/cm$^2$. To this end, each of the first and second hole-type hosts host_h1 and host_h2 is formed of a material equal to or different from that of the hole transport layer 144. For example, the first and second hole-type hosts host_e1 and host_e2 are formed of TCTA (4,4',4"-tris(N-carbazolyl)-triphenylamine), or CBP (4,4'-bis(carbazol-9-yl)biphenyl), for example. Here, the first hole-type host host_h2 in the first emission mixed layer 126a and the second hole-type host host_h2 in the second emission mixed layer 126b are formed of the same material or different materials.

The rate of the electron-type host host_e1 in the second emission mixed layer 126b proximate to the electron transport layer 148 is higher than the rate of the electron-type host host_e2 in the first emission mixed layer 126a, and the rate of the hole-type host host_h1 in the first emission mixed layer 126a proximate to the hole transport layer 144 is higher than the rate of the hole-type host host_h2 in the second emission mixed layer 126b. For example, the ratio of the first hole-type host host_h1 to the second electron-type host host_e2 in the first emission mixed layer 126a proximate to the hole transport layer 144 is 4~7:3~6. In addition, the ratio of the first electron-type host host_e1 to the second hole-type host host_h2 in the second emission mixed layer 126b proximate to the electron transport layer 148 is 6~9:1~4.

As such, the organic light emitting display device according to the present invention ensures easy hole and electron injection into the first and second emission mixed layers 126a and 126b, achieving voltage reduction as compared to the related art. In addition, in the organic light emitting display device according to the present invention, the hole and the electron, injected through the hole transport layer and the electron transport layer, move to an interface between the first and second emission mixed layers 126a and 126b, which may prevent loss of an exciton (i.e. electron-hole pair), and consequently prevent deterioration of luminous efficiency. Moreover, limiting an area for recombination of the hole and the electron to the emission layer 126 may prevent deterioration of the electron transport layer 148 and the hole transport layer 144 proximate to the emission layer 126, achieving extended lifespan and enhanced stability.

Table 3 represents electro-optic properties of an organic light emitting display device of the related art and the white organic light emitting display device according to the third embodiment of the present invention.

TABLE 3

| | 10 mA/cm$^2$ | | | |
|---|---|---|---|---|
| Condition | Volt(V) | Cd/A | CIEx | CIEy |
| Related Art | 7.2 | 62.6 | 0.301 | 0.337 |
| Third Embodiment | 7.1 | 67.8 | 0.300 | 0.351 |

In table 3, a configuration of the related art includes a single emission layer in which two hosts and a dopant are mixed with each other, and in the third embodiment of the present invention, the ratio of the first hole-type host host_h1 to the second electron-type host host_e2 in the first emission mixed layer 126a is 5.5:4.5, and the ratio of the second hole-type host host_h2 to the first electron-type host host_e1 in the second emission mixed layer 126b is 3:7. As exemplarily shown in table 3, it will be appreciated that the third embodiment of the present invention is superior to the organic light emitting display device of the related art in terms of drive voltage (V), luminance (cd/A), and chromaticity coordinates (CIEx and CIEy).

Figure 7:
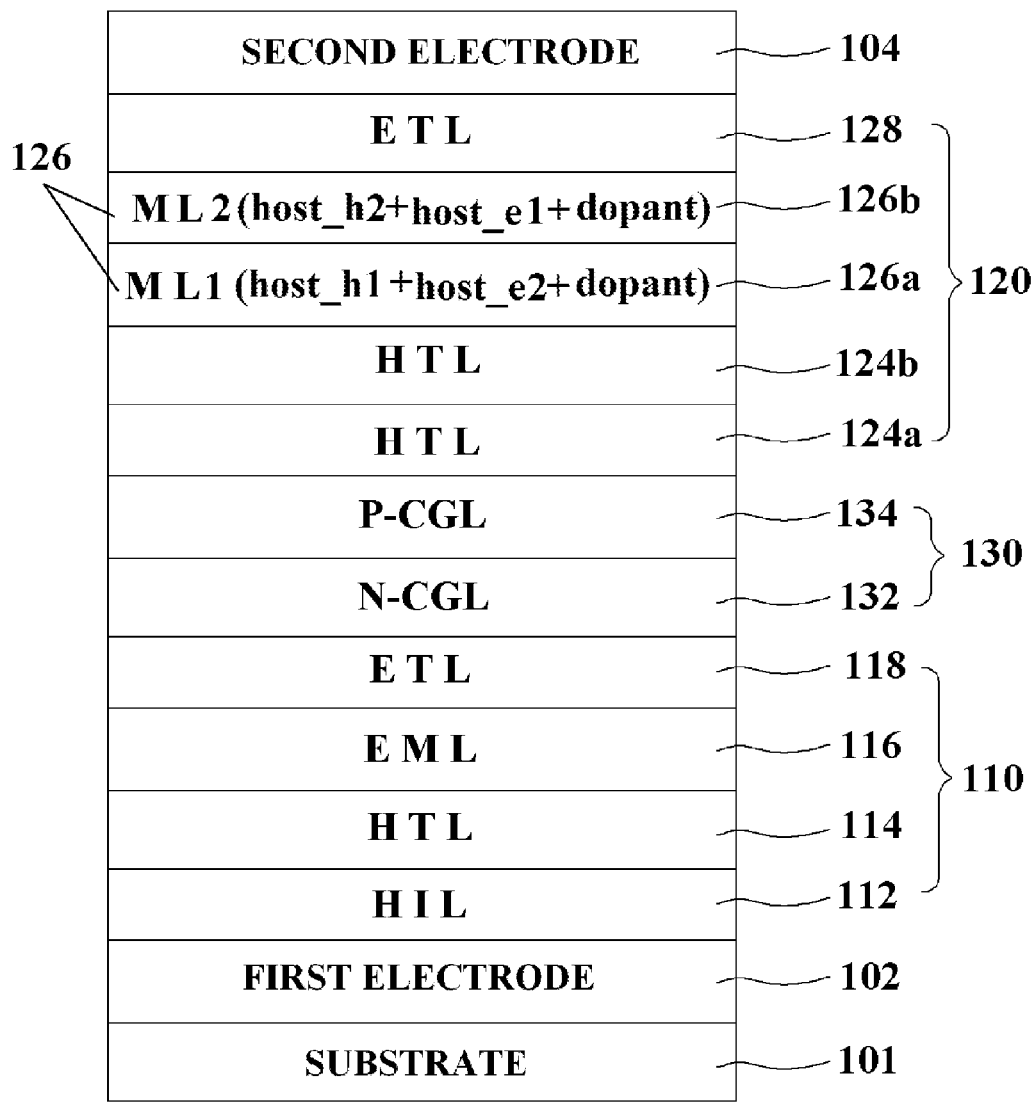
FIG. 7 is a sectional view showing an alternative configuration of the organic light emitting display device shown in FIG. 6.

Although the organic light emitting display device according to the third embodiment of the present invention has been described as including a single light emitting unit by way of example, the organic light emitting display device may be applied to a tandem configuration including a plurality of light emitting units 110 and 130 as exemplarily shown in FIG. 7.

Figure 8:
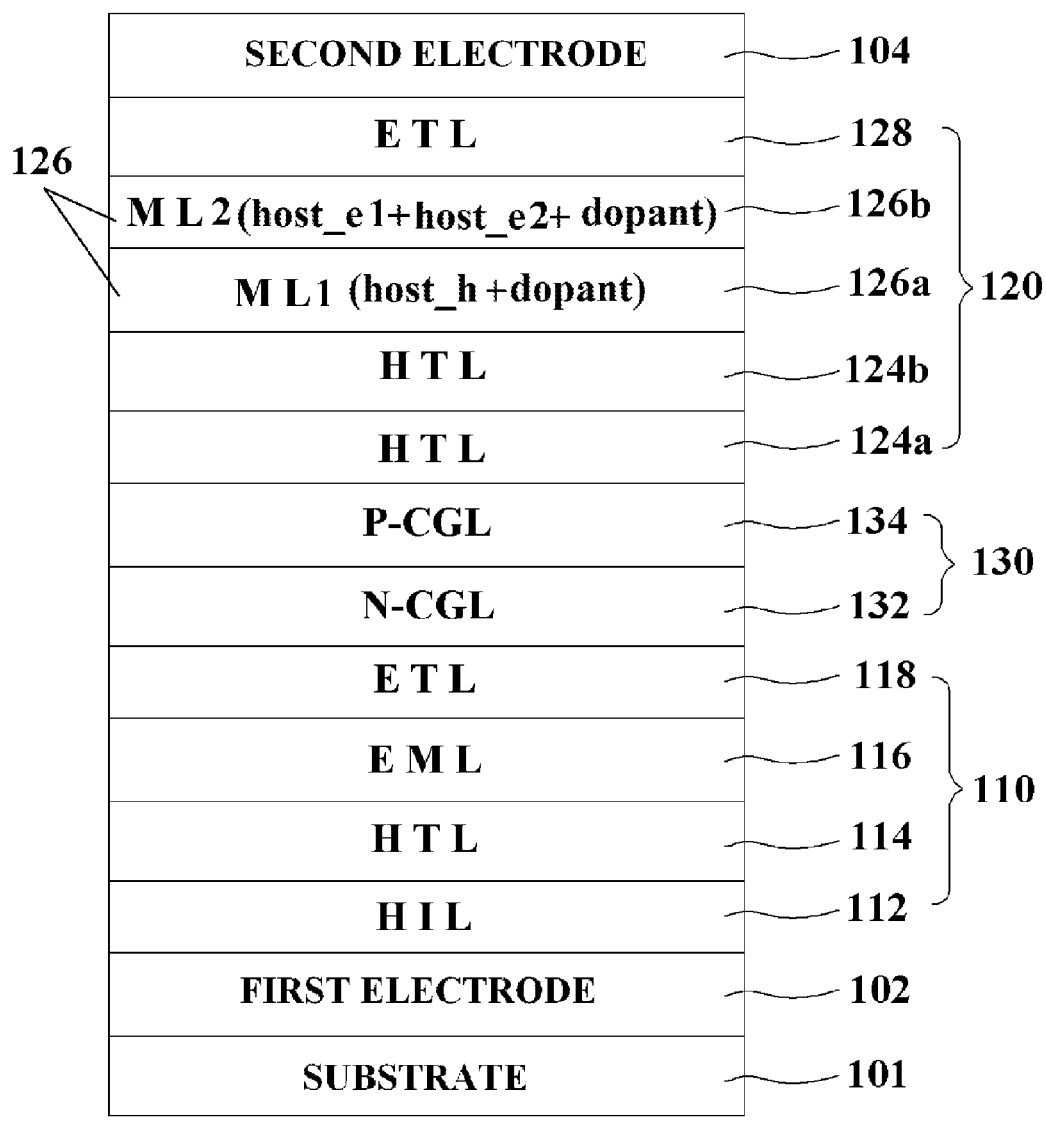
FIG. 8 is a sectional view showing an organic light emitting display device according to a fourth embodiment of the present invention.

FIG. 8 is a sectional view showing an organic light emitting display device according to a fourth embodiment of the present invention.

The organic light emitting display device exemplarily shown in FIG. 8 includes the same components as those of the organic light emitting display device exemplarily shown in FIG. 1 except for the second emission mixed layer including two electron-type hosts. Thus, a detailed description of these same components will be omitted hereinafter.

The second emission layer 126 exemplarily shown in FIG. 8 includes the first and second emission mixed layers (ML1 and ML2) 126a and 126b.

The first emission mixed layer 126a is formed on the third hole transport layer 124b to come into contact with the third hole transport layer 124b. The first emission mixed layer 126a is formed by mixing a hole-type host host_h having excellent transport of a hole into the second emission layer 126 and a first phosphorescent dopant with each other. The first phosphorescent dopant is a phosphorescent yellow-green dopant, and is formed of tris(2-phenylpyridine)iridium, for example. The first phosphorescent dopant occupies about 5 to 15% of the first emission mixed layer 126a. A difference between the HOMO level of the hole-type host host_h and the HOMO level of the third hole transport layer 124b is ±0.5 eV or less. To this end, the hole-type host host_h is formed of a material different from or equal to that of the third hole transport layer 124b. The hole-type host host_h is formed of a material having a hole mobility of $1.0\times10^{-6}$ Vs/cm$^2$ to $5.0\times10^{-3}$ Vs/cm$^2$. For example, the hole-type host host_h is formed of TCTA (4,4',4"-tris(N-carbazolyl)-triphenylamine), or CBP (4,4'-bis(carbazol-9-yl)biphenyl). Although the first emission mixed layer 126a including a single hole-type host has been described by way of example, the first emission mixed layer 126a may include a plurality of different hole-type hosts as exemplarily shown in FIG. 4.

The second emission mixed layer 126b is formed on the first emission mixed layer 126a to come into contact with the second electron transport layer 128. The second emission mixed layer 126b is formed by mixing first and second electron-type hosts host_e1 and host_e2, and a second phosphorescent dopant with each other. The second phosphorescent dopant is a phosphorescent yellow-green dopant equal to that of the first emission mixed layer 126a, and occupies about 5 to 15% of the second emission mixed layer 126b. A difference between the LUMO level of each of the first and second electron-type hosts host_e1 and host_e2 and the LUMO level of the second electron transport layer 128 is ±0.5 eV or less. The electron-type host host_e is formed of a material having an electron mobility of $1.0 \times 10^{-6}$ Vs/cm$^2$ to $5.0 \times 10^{-3}$ Vs/cm$^2$. To this end, the first and second electron-type hosts host_e1 and host_e2 are formed of a material different from or equal to that of the second electron transport layer 128, and the first and second electron-type hosts host_e1 and host_e2 are formed of the same material or different materials. In particular, any one electron-type host among the first and second electron-type hosts host_e1 and host_e2 is formed of a material having excellent transport of an electron into the second emission layer 126, and the other electron-type host is formed of a material having excellent energy transfer to the second phosphorescent dopant. For example, the first and second electron-type hosts host_e1 and host_e2 are formed of UGH3 (m-bis-(triphenylsilyl)benzene), or TAZ (3-phenyl-4-(1'-naphthyl)-5-phenyl-1,2,4-triazole).

As such, the organic light emitting display device according to the present invention ensures easy hole and electron injection into the first and second emission mixed layers 126a and 126b, achieving voltage reduction as compared to the related art. In addition, in the organic light emitting display device according to the present invention, the hole and the electron, injected through the hole transport layer and the electron transport layer, move to an interface between the first and second emission mixed layers 126a and 126b, which may prevent loss of an exciton (i.e. electron-hole pair), and consequently prevent deterioration of luminous efficiency. Moreover, limiting an area for recombination of the hole and the electron to the emission layer 126 may prevent deterioration of the electron transport layer 128 and the hole transport layer 124b proximate to the emission layer 126, achieving extended lifespan and enhanced stability.

Figure 9:
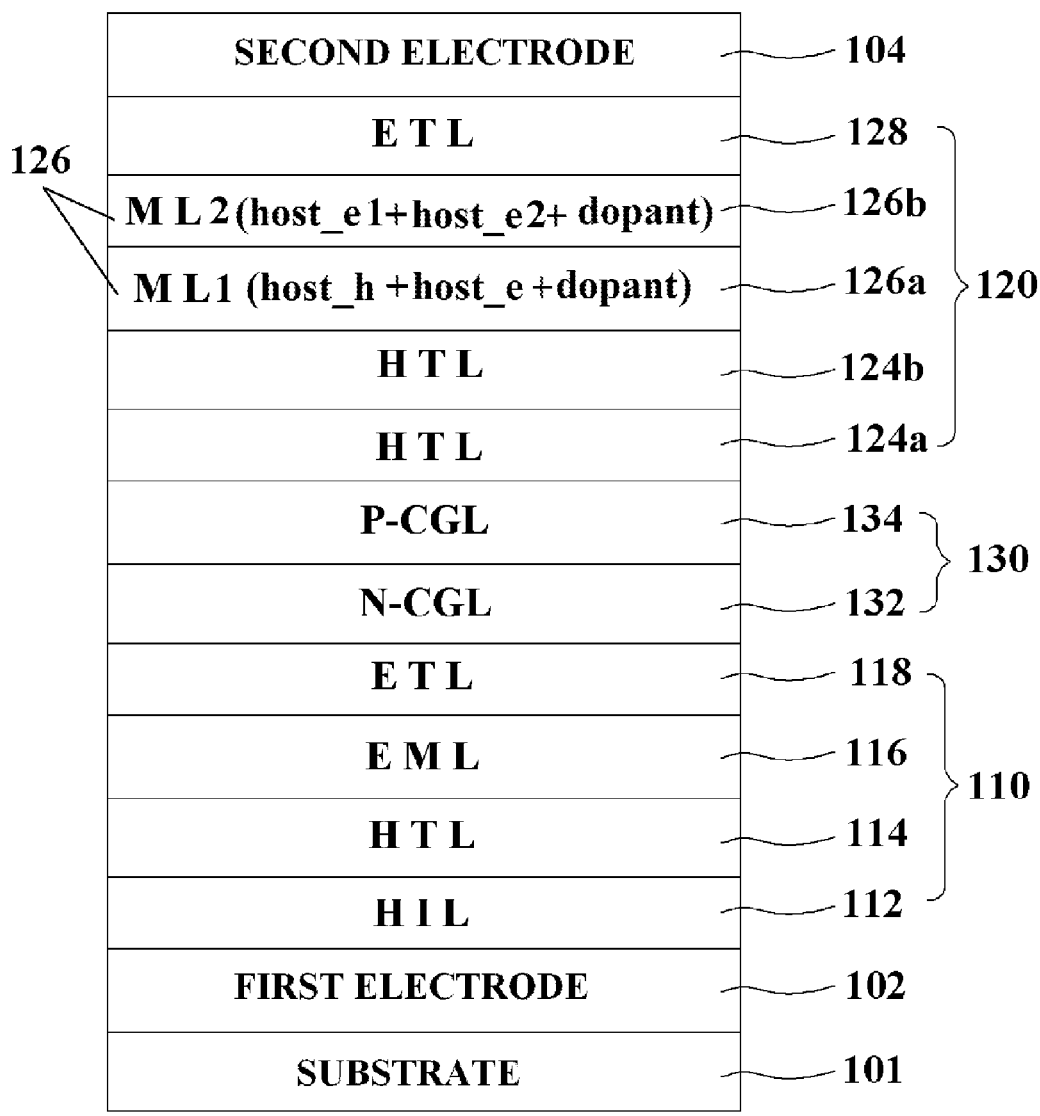
FIG. 9 is a sectional view showing an organic light emitting display device according to a fifth embodiment of the present invention.

FIG. 9 is a sectional view showing an organic light emitting display device according to a fifth embodiment of the present invention.

The organic light emitting display device exemplarily shown in FIG. 9 includes the same components as those of the organic light emitting display device exemplarily shown in FIG. 8 except for the first emission mixed layer further including an electron-type host. Thus, a detailed description of these same components will be omitted hereinafter.

The first emission mixed layer 126a exemplarily shown in FIG. 9 is formed on the third hole transport layer 124b to come into contact with the third hole transport layer 124b. The first emission mixed layer 126a is formed by mixing a hole-type host host_h having excellent transport of a hole into the second emission layer 126, an electron-type host host_e, and a first phosphorescent dopant with each other.

The first phosphorescent dopant is a phosphorescent yellow-green dopant, and is formed of tris(2-phenylpyridine) iridium, for example. The first phosphorescent dopant occupies about 5 to 15% of the first emission mixed layer 126a.

A difference between the HOMO level of the hole-type host host_h and the HOMO level of the third hole transport layer 124b is ±0.5 eV or less. To this end, the hole-type host host_h is formed of a material different from or equal to that of the third hole transport layer 124b. The hole-type host host_h is formed of a material having a hole mobility of $1.0 \times 10^{-6}$ Vs/cm$^2$ to $5.0 \times 10^{-3}$ Vs/cm$^2$. For example, the hole-type host host_h is formed of TCTA (4,4',4"-tris(N-carbazolyl)-triphenylamine), or CBP (4,4'-bis(carbazol-9-yl)biphenyl).

A difference between the LUMO level of the electron-type host host_e and the LUMO level of the electron transport layer 128 is ±0.5 eV or less. The electron-type host host_e is formed of a material having an electron mobility of $1.0 \times 10^{-6}$ Vs/cm$^2$ to $5.0 \times 10^{-3}$ Vs/cm$^2$. To this end, the electron-type host host_e is formed of a material equal to or different from a material of any one of the first and second electron-type hosts hostel and host_e2 or a material of the electron transport layer 128. For example, the electron-type host host_e is formed of UGH3 (m-bis-(triphenylsilyl)benzene), or TAZ (3-phenyl-4-(1'-naphthyl)-5-phenyl-1,2,4-triazole).

The rate of the electron-type host host_e in the second emission mixed layer 126b proximate to the electron transport layer 128 is higher than the rate of the electron-type host host_e in the first emission mixed layer 126a. For example, the ratio of the hole-type host host_h to the electron-type host host_e in the first emission mixed layer 126a proximate to the hole transport layer 124b is 4~7:3~6.

As such, the organic light emitting display device according to the present invention ensures easy hole and electron injection into the first and second emission mixed layers 126a and 126b, achieving voltage reduction as compared to the related art. In addition, in the organic light emitting display device according to the present invention, the hole and the electron, injected through the hole transport layer and the electron transport layer, move to an interface between the first and second emission mixed layers 126a and 126b, which may prevent loss of an exciton (i.e. electron-hole pair), and consequently prevent deterioration of luminous efficiency. Moreover, limiting an area for recombination of the hole and the electron to the emission layer 126 may prevent deterioration of the electron transport layer 128 and the hole transport layer 124b proximate to the emission layer 126, achieving extended lifespan and enhanced stability.

Although the organic light emitting display device according to the present invention has been described has including two emission mixed layers by way of example, the organic light emitting display device may include three or more emission mixed layers. In this case, the content of the hole-type host host_h gradually increases with decreasing distance to the hole transport layer 124b, and the content of the electron-type host host_e gradually increases with decreasing distance to the electron transport layer 128.

Although the organic light emitting display device according to the present invention has been described has including two light emitting units by way of example, the organic light emitting display device may include three or more light emitting units. For example, three light emitting units 110, 120, and 140 may be provided as exemplarily shown in FIG. 10.

Figure 10:
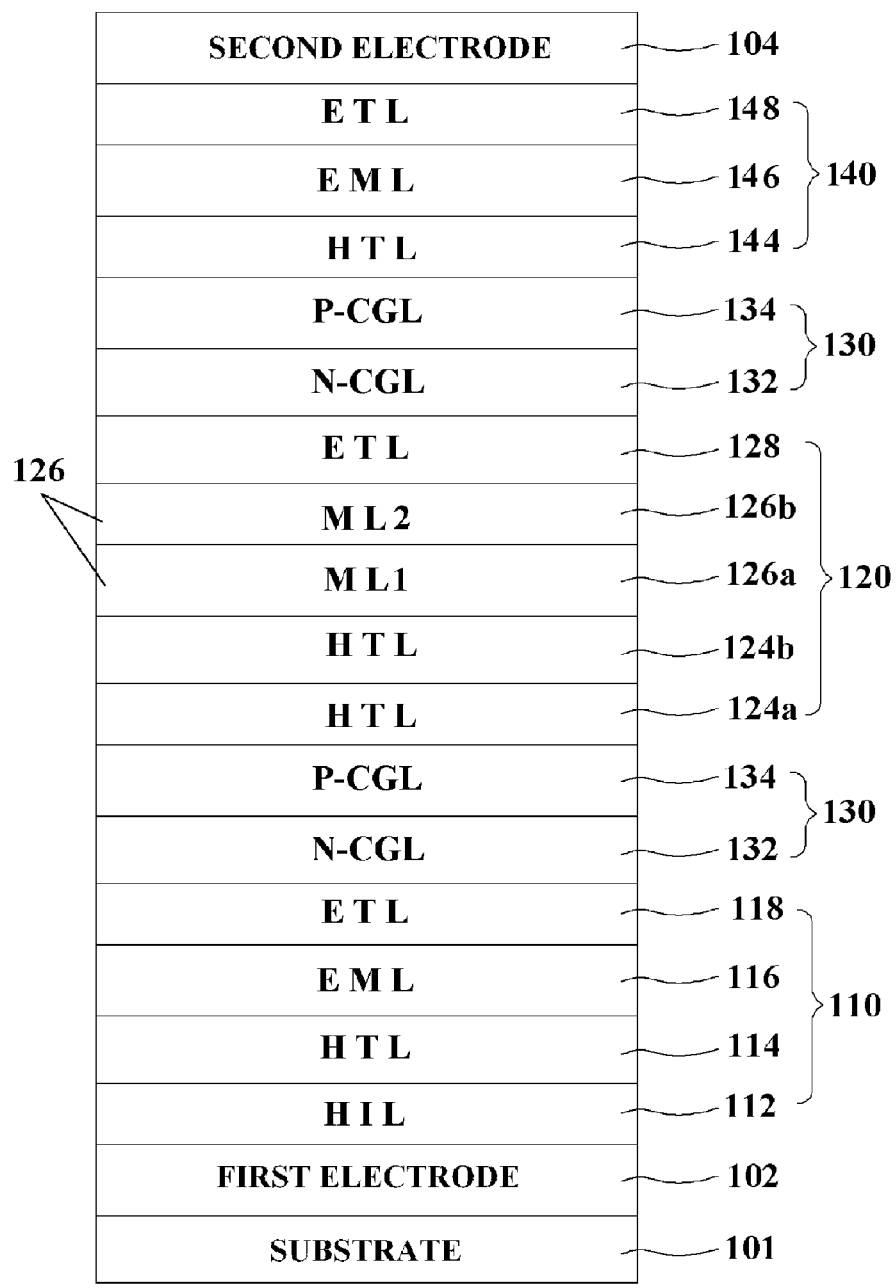
FIG. 10 is a sectional view showing an organic light emitting display device including three light emitting units according to the present invention.

More specifically, it will be appreciated from the following table 4 that a configuration of the present invention as exemplarily shown in FIG. 10 in which the first emission mixed layer 126a includes the first and second hole-type hosts and the phosphorescent dopant and the second emission mixed layer 126b includes the electron-type host and the phosphorescent dopant as exemplarily shown in FIG. 4 has longer lifespan and higher luminance as well as lower operating voltage than a configuration of the related art including a single emission layer in which two hosts and a dopant are mixed.

TABLE 4

| Condition | T95(50 mA/cm²) | 50 mA/cm² Volt(V) | Cd/A |
|---|---|---|---|
| Related Art | 100% | 100% | 100% |
| Embodiment(Configuration of FIG. 10) | 120% | 96% | 103% |

It will be appreciated from the following table 5 that a configuration of the present invention as exemplarily shown in FIG. 10 in which the first emission mixed layer 126a includes the first and second hole-type hosts and the phosphorescent dopant and the second emission mixed layer 126b includes the first and second electron-type hosts and the phosphorescent dopant has longer lifespan and lower operating voltage than a configuration of the related art including a single emission layer in which two hosts and a dopant are mixed.

TABLE 5

| Condition | T95(50 mA/cm²) | 50 mA/cm² Volt(V) | Cd/A |
|---|---|---|---|
| Related Art | 100% | 100% | 100% |
| Embodiment(Configuration of FIG. 10) | 120% | 99% | 100% |

Figure 11:
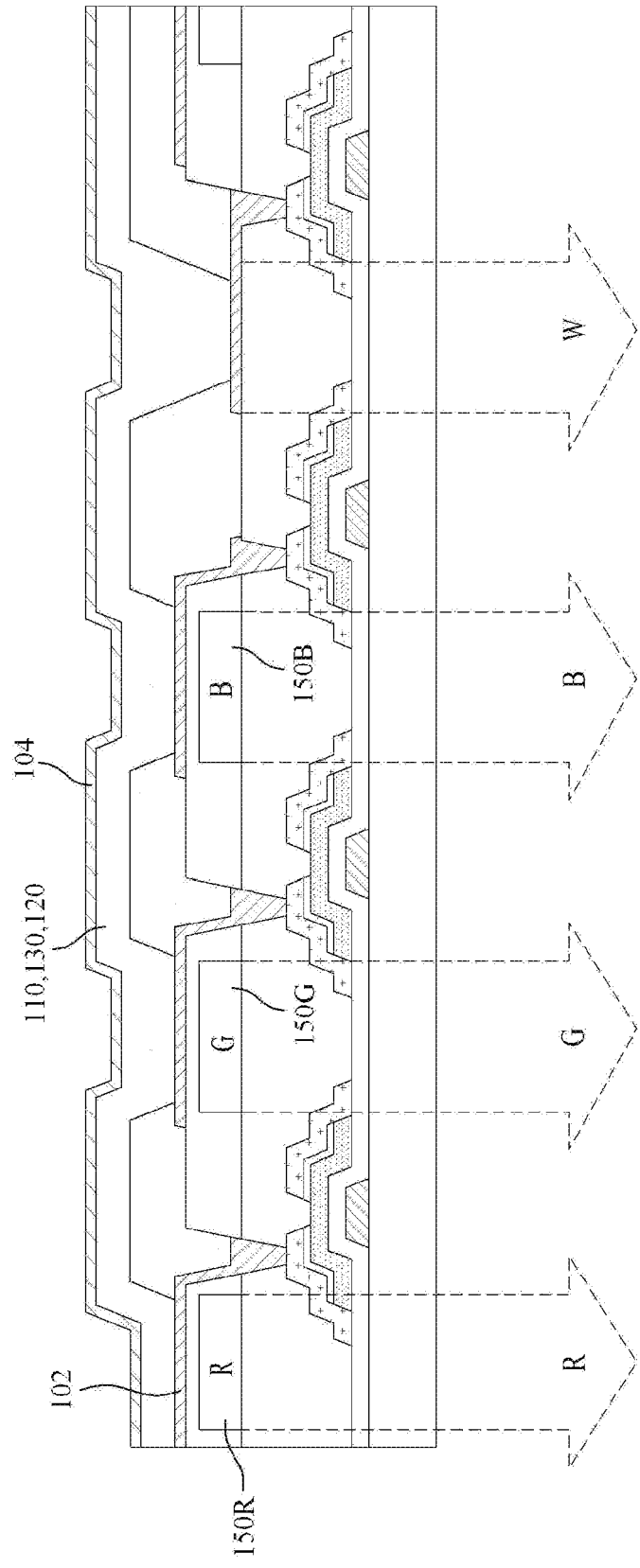
FIG. 11 is a sectional view showing an organic light emitting display device including color filters according to the present invention.

The organic light emitting display device according to the present invention, as exemplarily shown in FIG. 11, may be applied to a configuration including red, green, and blue color filters 150R, 150G, and 150B. That is, white light generated in the emission layers 116 and 126 exemplarily shown in FIGS. 1, 4, 6, and 7 to 10 is changed into red light while passing through a sub-pixel area provided with the red color filter 150R, into green light while passing through a sub-pixel area provided with the green color filter 150G, and into blue light while passing through a sub-pixel area provided with the blue color filter 150B, and directly passes through a sub-pixel area provided with no color filter.

As is apparent from the above description, an organic light emitting display device according to the present invention ensures easy hole and electron injection into first and second emission mixed layers, achieving voltage reduction as compared to the related art. In addition, in the organic light emitting display device according to the present invention, a hole and an electron, injected through a hole transport layer and an electron transport layer, move to an interface between the first and second emission mixed layers, which may prevent loss of an exciton (i.e. electron-hole pair), and consequently prevent deterioration of luminous efficiency. Moreover, limiting an area for recombination of the hole and the electron to the emission layer may achieve extended lifespan and enhanced stability. Moreover, price reduction may be accomplished via reduction in the content of a phosphorescent dopant.

It will be apparent that, although the preferred embodiments have been shown and described above, the invention is not limited to the above-described specific embodiments, and various modifications and variations can be made by those skilled in the art without departing from the gist of the appended claims. Thus, it is intended that the modifications and variations should not be understood independently of the technical sprit or prospect of the invention.

What is claimed is:

1. An organic light emitting display device comprising:
first and second electrodes facing each other on a substrate;
at least one emission layer between the first and second electrodes;
a hole transport layer between the first electrode and the emission layer; and
an electron transport layer between the second electrode and the emission layer, wherein the emission layer includes:
a first emission mixed layer on the hole transport layer, the first emission mixed layer including a first hole-type host, a second electron-type host, and a first phosphorescent dopant; and
a second emission mixed layer between the first emission mixed layer and the electron transport layer, the second emission mixed layer including a first electron-type host, a second hole-type host, and a second phosphorescent dopant,
wherein the content of the first hole-type host is higher than the content of the second electron-type host in the first emission mixed layer, and the content of the first electron-type host is higher than the content of the second hole-type host in the second emission mixed layer.

2. The device according to claim 1, wherein a difference between the Lowest Unoccupied Molecular Orbital (LUMO) level of each of the first and second electron-type hosts and the LUMO level of the electron transport layer is ±0.5 eV or less, and
wherein a difference between the Highest Occupied Molecular Orbital (HOMO) level of each of the first and second hole-type hosts and the HOMO level of the hole transport layer is ±0.5 eV or less.

3. The device according to claim 2, wherein the first and second hole-type hosts have a hole mobility of $1.0\times10^{-6}$ Vs/cm² to $5.0\times10^{-3}$ Vs/cm², and
wherein the first and second electron-type hosts have an electron mobility of $1.0\times10^{-6}$ Vs/cm² to $5.0\times10^{-3}$ Vs/cm².

4. The device according to claim 1, wherein the first and second phosphorescent dopants are composed of the same material or different materials.

5. The device according to claim 1, wherein a ratio of the first hole-type host to the second electron-type host in the first emission mixed layer is 4~7:3~6, and
wherein a ratio of the first electron-type host to the second hole-type host in the second emission mixed layer is 6~9:1~4.

6. The device according to claim 1, wherein the at least one emission layer includes three or more emission mixed layers including the first and second emission mixed layers,
wherein the content of the hole-type host in the at least one emission layer gradually increases with decreasing distance to the hole transport layer, and
wherein the content of the electron-type host in the at least one emission layer gradually increases with decreasing distance to the electron transport layer.

7. The device according to claim 1, further comprising red, green, and blue color filters on the substrate.

8. An organic light emitting display device comprising:
first and second electrodes facing each other on a substrate;
at least two emission layers between the first and second electrodes;

an N-type charge generation layer and a P-type charge generation layer sequentially stacked one above another between the at least two emission layers;
a hole transport layer between the first electrode and the N-type charge generation layer; and
an electron transport layer between the second electrode and the P-type charge generation layer,
wherein the at least two emission layers include:
a first emission mixed layer on the hole transport layer, the first emission mixed layer including a first hole-type host and a first phosphorescent dopant; and
a second emission mixed layer between the first emission mixed layer and the electron transport layer, the second emission mixed layer including a first electron-type host and a second phosphorescent dopant.

9. The device according to claim 8, wherein a difference between the Lowest Unoccupied Molecular Orbital (LUMO) level of each of the first and second electron-type hosts and the LUMO level of the electron transport layer is ±0.5 eV or less, and
wherein a difference between the Highest Occupied Molecular Orbital (HOMO) level of each of the first and second hole-type hosts and the HOMO level of the hole transport layer is ±0.5 eV or less.

10. The device according to claim 9, wherein the first and second hole-type hosts have a hole mobility of $1.0 \times 10^{-6}$ Vs/cm$^2$ to $5.0 \times 10^{-3}$ Vs/cm$^2$, and
wherein the first and second electron-type hosts have an electron mobility of $1.0 \times 10^{-6}$ Vs/cm$^2$ to $5.0 \times 10^{-3}$ Vs/cm$^2$.

11. The device according to claim 8, wherein the first emission mixed layer further includes a second electron-type host,
wherein the second emission mixed layer further includes a second hole-type host, and
wherein the content of the first hole-type host is higher than the content of the second electron-type host in the first emission mixed layer, and the content of the first electron-type host is higher than the content of the second hole-type host in the second emission mixed layer.

12. The device according to claim 11, wherein a ratio of the first hole-type host to the second electron-type host in the first emission mixed layer is 4~7:3~6, and
wherein a ratio of the first electron-type host to the second hole-type host in the second emission mixed layer is 6~9:1~4.

13. The device according to claim 8, wherein the at least two emission layers include three or more emission mixed layers including the first and second emission mixed layers,
wherein the content of the hole-type host in the emission layer gradually increases with decreasing distance to the hole transport layer, and
wherein the content of the electron-type host in the emission layer gradually increases with decreasing distance to the electron transport layer.

14. The device according to claim 8, further comprising red, green, and blue color filters on the substrate.

* * * * *